United States Patent [19]

Fujiyama et al.

[11] Patent Number: 4,866,742

[45] Date of Patent: Sep. 12, 1989

[54] REGISTER CIRCUIT WITH PLURAL REGISTERS SIMULTANEOUSLY RESET WHEN A SELECTED REGISTER RECEIVES DATA

[75] Inventors: Hiroyuki Fujiyama, Hino; Sinji Nishikawa, Kawasaki, both of Japan

[73] Assignee: Fujitsu Limited, Kawasaki, Japan

[21] Appl. No.: 164,287

[22] Filed: Mar. 4, 1988

[30] Foreign Application Priority Data

Mar. 17, 1987 [JP] Japan .................... 62-060162

[51] Int. Cl.[4] .................... H03K 19/03; H04Q 3/52
[52] U.S. Cl. .................... 377/70; 307/247.1; 340/825.87; 340/825.88
[58] Field of Search .................... 307/247.1; 377/73, 70, 377/77, 81, 67; 340/825.87, 825.88

[56] References Cited

U.S. PATENT DOCUMENTS

| | | | |
|---|---|---|---|
| 3,274,555 | 9/1966 | Luke | 377/67 |
| 4,045,693 | 8/1977 | Ester | 307/247.1 |
| 4,068,215 | 1/1978 | Mukaemachi et al. | 340/825.87 |
| 4,289,976 | 9/1981 | Maly | 307/247.1 |
| 4,419,762 | 12/1983 | Paul | 377/73 |

OTHER PUBLICATIONS

Digital Troubleshooting by Gasperini Copyright 1975, 76, pub. by Movonics Co., pp. 9.3, 9.4, 10.5.

Primary Examiner—John S. Heyman
Attorney, Agent, or Firm—Armstrong, Nikaido, Marmelstein, Kubovcik & Murray

[57] ABSTRACT

A register circuit comprises a plurality of registers commonly receiving a data signal and selection signals respectively, each of the registers including a first input terminal for receiving the data signal; a second input terminal for receiving a corresponding one of the selection signals; an output terminal for outputting a stored data signal; a storing unit, connected to the output terminal, for storing the data signal; and a control unit, connected to the storing unit, the first input terminal, the second input terminal, and the output terminal, for transferring the data signal to the storing unit when the selection signal is effective and resetting the storing unit when the data signal is already stored in the storing unit and the selection signal is not effective.

4 Claims, 4 Drawing Sheets

TO OTHER BIT REGISTERS

REGISTER CIRCUIT WITH PLURAL REGISTERS SIMULTANEOUSLY RESET WHEN A SELECTED REGISTER RECEIVES DATA

BACKGROUND OF THE INVENTION

1. Field of the Invention

The present invention relates to a register circuit, particularly to a register circuit including a plurality of registers, wherein an effective data is set in a selected register and the remaining registers are reset simultaneously with the setting of the effective data in the selected register.

2. Description of the Related Art

In the conventional register circuit including a plurality of registers each storing a predetermined number of bit data, each of the registers is constituted by a predetermined number of, for example, D-type flip-flop circuits, and an address signal is input to each of the registers. Also, the predetermined number of bit data is input to each of the registers.

When one of the above address signals becomes effective, the above data input to each of the registers at that time is stored in the selected register receiving the effective address signal. In this connection, the data already stored in the remaining registers receiving address signals which are not effective is not changed but maintained as is.

Thus, according to the above conventional register circuit, it is only possible to independently control the data stored in the selected register receiving the effective address signal in accordance with the value of the above input data, and the data already stored in the remaining registers receiving the address signals which are not effective is maintained without change.

Therefore, in the above register circuit, if a request is sent to set an effective data (i.e., "1") in a selected register, and to reset the remaining registers, each value of the data already stored in the registers must be monitored outside of the register circuit (e.g., each value of the above data must be successively read out to the outside or each value of the above data must be stored at the outside by, for example, programming). Then, to write new data "1" or "0" to predetermined registers, it must be determined whether the value of the new data to be written to a predetermined register is different from that of the data already stored in the corresponding register, to prevent data "1" from being simultaneously set in more than one register (i.e., to prevent a double registration).

Therefore, in the conventional register circuit, a problem arises in that a very complicated process is necessary to set the effective data in a selected register and to reset the remaining registers without generating a double registration.

SUMMARY OF THE INVENTION

The present invention has been created to solve the above-mentioned problem, and the object of the present invention is to set the effective data in a selected register, and simultaneously, reset the remaining registers, to thus surely prevent a double registration at the registers without the need for the above complicated operation (i.e., without carrying out the above monitoring and writing operation).

To attain the above object, according to one aspect of the present invention, there is provided a register circuit comprising a plurality of registers commonly receiving a data signal and selection signals respectively, each of the registers including a first input terminal for receiving the data signal; a second input terminal for receiving a corresponding one of the selection signals; an output terminal for outputting a stored data signal; storing device, connected to the output terminal, for storing the data signal; and a control device, connected to the storing device, the first input terminal, the second input terminal, and the output terminal, for transferring the data signal to the storing device when the selection signal is effective and resetting the storing device when the data signal is already stored in the storing device and the selection signal is not effective.

DESCRIPTION OF THE PREFERRED EMBODIMENTS

Figure 1:
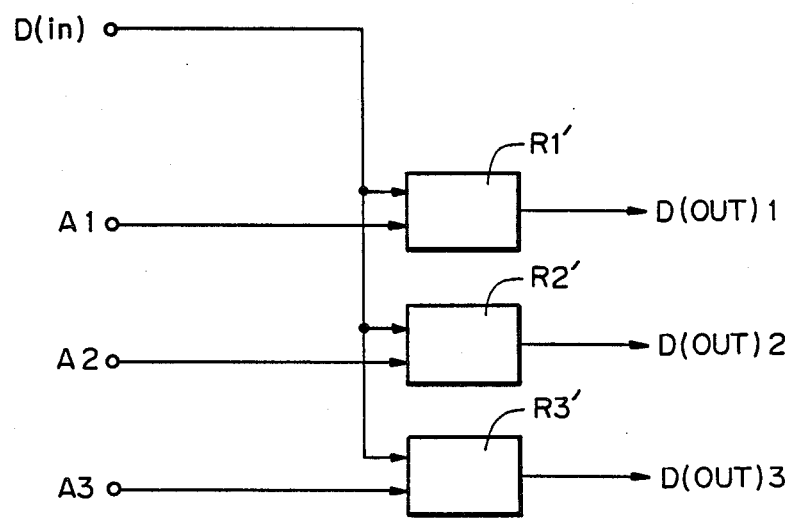
FIG. 1 is a block diagram showing an example of a conventional register circuit including a plurality of registers.

In order to clarify the background of the present invention, a conventional register circuit comprising a plurality of registers is exemplified in FIG. 1. The register circuit shown in FIG. 1 comprises three registers (1-bit registers) R1', R2', and R3', and address signals A1, A2, and A3 are input respectively to the registers R1', R2', and R3'. Also, data D(in) is input to each of the registers R1', R2', and R3'. Each of the registers R1', R2', and R3' is constituted by, for example, a D-type flip-flop circuit.

When one of the above address signals A1 to A3 (e.g., the address signal A1) becomes effective, i.e., becomes "1"), the data D(in) input to each of the registers at that time is stored in the selected register (e.g., the register R1') receiving the effective address signal.

For example, if the address signal A1 becomes effective (e.g., becomes "1") and the data D(in) input to the register R1' at that time is "1", the data "1" is set in the register R1', and as a result, the output $D_{OUT}1$ of the register R1' also becomes "1" (e.g., high potential level).

On the other hand, if the address signal A1 becomes effective (e.g., becomes "1") and the data D(in) input to the register R1' at that time is "0", the register R1' is reset, and as a result the output D(OUT)1 of the register R1' becomes "0" (e.g., low potential level).

In this connection, the data already stored in the remaining registers (e.g., registers R2' and R3') receiving address signals which are not effective (e.g., "0") is not changed (i.e., the already stored data is maintained as is, and as a result, the outputs D(OUT)2 and D(OUT)3 of the registers R2' and R3' are not changed.

In other words, in the register receiving the effective address signal, the register is set or reset (i.e., the data stored in the register becomes "1" or "0"), in accordance with the value (i.e., "1" or "0") of the data D(in) input to the register. Also, in the register receiving address signals which are not effective, data already stored in the registers is not changed (i.e., the already stored data is maintained as is).

Thus, according to the above conventional register circuit, it is only possible to independently control the data stored in the selected register (i.e., to set or reset the selected register) receiving the effective address signal in accordance with the value of the above data D(in), and the data already stored in the remaining registers receiving the address signals which are not effective is maintained without change.

In the above case, although each of the registers R1', R2', and R3' is a one bit register, even if each of the above registers is storing a plurality of bit data, it is only possible to independently control the plurality of bit data stored in the selected register receiving the effective address signal in accordance with the plurality of bit data D(in) supplied to the selected register, and the data already stored in the remaining registers receiving the address signals which are not effective is not changed, as above-mentioned.

Therefore, in the above register circuit, if a request is sent to set data "1" in a selected register and to reset the remaining registers, each value of the data already stored in the registers must be monitored outside of the register circuit (e.g., each value of the above data must be successively read out to the outside or each value of the above data must be stored at the outside by, for example, programming). Then, to write new data "1" or "0" to predetermined registers, it must be determined whether the value of the new data to be written to a predetermined register is different from that of the data already stored in the corresponding register, to prevent data "1 from being simultaneously set in more than one register (i.e., to prevent a double registration).

For example, in the circuit shown in FIG. 1, if a request is sent to write data "0", "1", and "0" in the registers R1', R2', and R3', respectively, when the data "1", "0", and "0" is already stored in the registers R1', R2', and R3', respectively, a read of the data already stored in the registers must be first carried out. Then, in the register R1' in which the data "1" is already stored, the register R1' is reset by supplying the effective address signal A1 and the data D(in) having the value "0." to the register R1'. Next, in the register R2' in which the data "0" is already stored, the register R2' is set by supplying the effective address signal A2 and the data D(in) having the value "1" to the register R2'.

Therefore, in the conventional register circuit as shown in FIG. 1, a problem arises in that the above complicated process is necessary to set the data which is effective (e.g., the data "1") in a selected register and to reset the remaining registers without generating a double registration.

Figure 2:
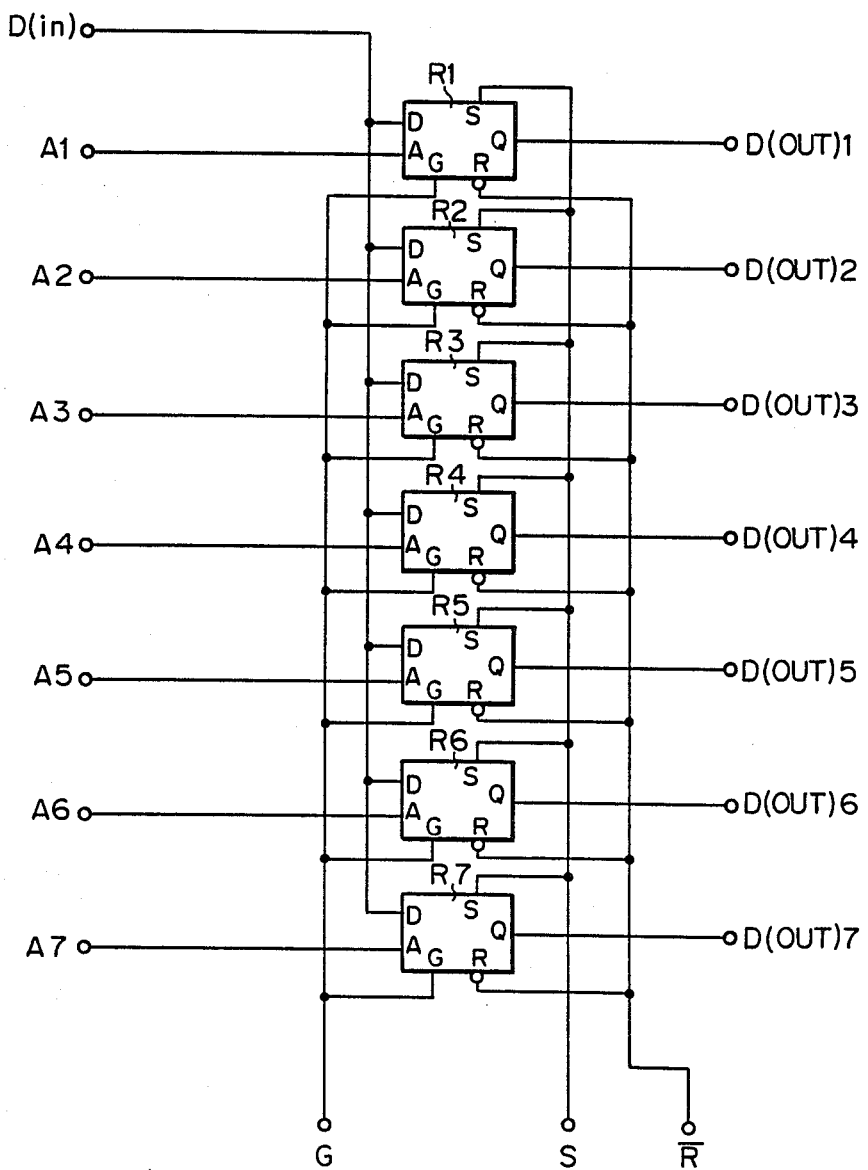
FIG. 2 is a block diagram showing the entire construction of the register circuit according to one embodiment of the present invention.

The present invention has been created to solve the above-mentioned problem, and FIG. 2 shows the entire construction of one embodiment of the register circuit according to the present invention. As shown in FIG. 2, the register circuit comprises a plurality of bit registers (in this case, seven bit registers R1 to R7), and address signals (bit selection signals) A1 to A7 are input respectively to the bit registers R1 to R7 through corresponding input terminals A. Also, data D(in) is input commonly to each of the bit registers R1 to R7 through corresponding input terminals D. When one of the address signals (bit selection signals) A1 to A7 (e.g., the signal A1) becomes effective (e.g., becomes "1"), the remaining address signals (e.g., the signals A2 to A7) become ineffective (e.g, become "0").

When the data D(in) which is effective (e.g., "1") is input to the bit registers R1 to R7 when one of the address signals (e.g., A1) is effective, the effective data D(in) is set in the bit register (e.g., R1) receiving the effective address signal (e.g., A1), and as a result, the output supplied from a corresponding output terminal Q (in this case, D(OUT)1) of the corresponding bit register becomes "1" (e.g., high potential level). On the other hand, in the remaining bit registers (in this case, R2 to R7) receiving the address signals which are not effective, the bit registers R2 to R7 are reset simultaneously with the setting of the effective data in the bit register R1 receiving the effective address signal, and as a result, the outputs supplied from corresponding output terminals Q (in this case, D(OUT)2 to D(OUT)7) of the remaining bit registers become "0" (e.g., low potential level).

A gate signal G is also supplied to the bit registers R1 to R7, and each of the bit registers is set or reset as above-mentioned and latched as is, when the gate signal G is supplied to the bit registers.

Further, a set signal S is supplied to each of the bit registers R1 to R7, and the effective data (e.g., "1") is initially set in the bit registers when receiving the set signal S having a predetermined value (in this case, "1"). Also, a reset signal $\overline{R}$ is supplied to each of the bit registers R1 to R7, and the bit registers are initially reset when receiving the reset signal $\overline{R}$ having a predetermined value (in this case, "0"). Thus, it is possible to initially set or reset each of the bit registers, when electric power is supplied to each of the bit registers, for example, regardless of the supply of predetermined address signals and the effective data D(in).

Figure 3:
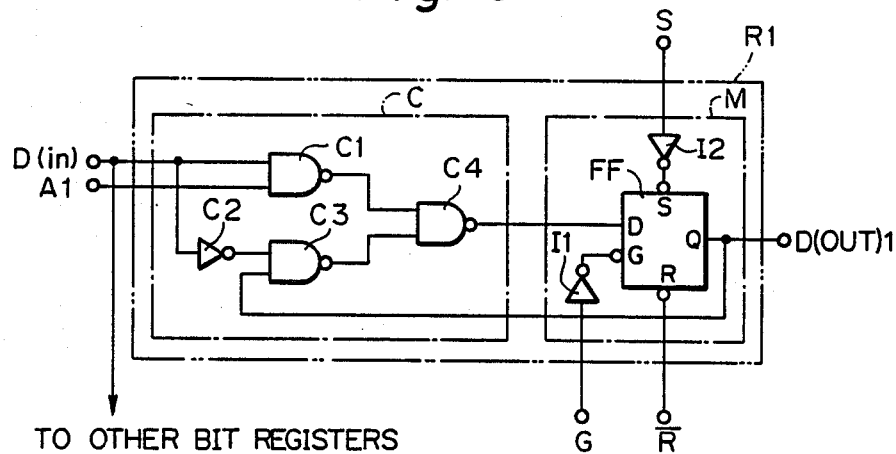
FIG. 3 is a circuit diagram showing a concrete example of the construction of a bit register included in the register circuit shown in FIG. 2.

FIG. 3 is a circuit diagram showing an example of the construction of one of the bit registers (e.g., the bit register R1) included in the register circuit shown in FIG. 2. In FIG. 3, reference symbol C denotes a controlling circuit portion (control means) and reference symbol M denotes a register portion (storing means).

The controlling circuit portion C comprises NAND gates C1, C3, and C4, and an inverter C2. The data D(in) and the address signal (the bit selection signal) A1 are input to the NAND gate C1. The data D(in) is also input to the inverter C2. The output signal from the inverter C2 is supplied to the NAND gate C3 as one input, and the output signal from a D type flip-flop circuit FF provided in the register portion M is fed back to the NAND gate C3 as another input. The output signals from the NAND gates C1 and C3 are input to the NAND gate C4.

The register portion (storing means) M comprises the D type flip-flop circuit FF and inverters I1 and I2, and the output signal from the NAND gate C4 is input to the terminal D of the flip-flop circuit FF. The gate signal G is input to the terminal G of the flip-flop circuit FF through the inverter I1; the set signal S is input to the terminal S of the flip-flop circuit FF through the inverter I2; and, the reset signal $\overline{R}$ is directly input to the terminal $\overline{R}$ of the flip-flop circuit FF. The output Q of the flip-flop circuit FF is supplied from the output terminal thereof to the outside, as the output signal D(OUT)1.

Thus, the state of the output Q of one of the bit registers (e.g., the bit register R1) produced when the data D(in), the corresponding address signal A (e.g., the address signal A1), the gate signal G, the set signal S, and the reset signal $\bar{R}$, each having a predetermined value (i.e., "1" or "0") are input to the corresponding bit register (e.g., the bit register R1) is represented by a Truth Table, as shown in the following Table I.

TABLE I

| D(in) | A | G | S | $\bar{R}$ | Q |
|---|---|---|---|---|---|
| 0 | * | 1 | 0 | 1 | Qn (Maintenance of Former State without change) |
| 1 | 0 | 1 | 0 | 1 | 0 (Reset) |
| 1 | 1 | 1 | 0 | 1 | 1 (Set) |
| * | * | 0 | 0 | 1 | Qn (Maintenance of Former State without change) |
| * | * | * | 0 | 0 | 0 (Initially Resetting to "0") |
| * | * | * | 1 | * | 1 (Initially Setting to "1") |

As shown in the third line of Table I, when the data D(in) and the address signal A, both of which are effective (i.e., "1"), are input to a predetermined bit register, the data "1" is set in the corresponding bit register (i.e., the output Q of the bit register becomes "1") when the effective gate signal G having the value the corresponding bit register. At that time, both the set signal S and the reset signal $\bar{R}$ are made ineffective (i.e., "0" and "1", respectively).

Also, as shown in the second line of Table I, when the data D(in), which is effective (i.e., "1"), and the address signal A, which is not effective (i.e., "038"), are input to a predetermined bit register, the corresponding bit register is reset (i.e., the output Q of the bit register becomes "0") when the effective gate signal G having the value "1" is input to the corresponding bit register. At that time, both the set signal S and the reset signal $\bar{R}$ are made ineffective (i.e., "0" and "1", respectively).

In this connection, in the conventional register circuit as shown in FIG. 1, if the address signal A supplied to a predetermined bit register is not effective (i.e., "0"), the data already stored in the corresponding bit register is maintained without change, even if the effective data D(in) having the value "1" is supplied to the corresponding bit register, as above-mentioned.

Also, as shown in the first line of Table I, when the data D(in) supplied to the bit registers is not effective (i.e., "0"), the data already stored in the bit registers (i.e., each output Q of the bit registers) is maintained without change, regardless of the value of the address signal A supplied to the respective register, and regardless of the supply of the effective gate signal G having the value "1". Of course, at that time, both the set signal S and the reset signal $\bar{R}$ are made ineffective.

In this connection, in the conventional register circuit as shown in FIG. 1, if the address signal A supplied to a predetermined bit register is effective (i.e., "1") and the data D(in) supplied to the corresponding bit register is not effective (i.e., "0"), the corresponding bit register is reset (i.e., the output Q of the corresponding bit register becomes "0").

Further, as shown in the fourth line of Table I, while the gate signal G supplied to the bit registers is not effective (i.e., "0"), the data already stored in the bit registers (i.e., each output Q of the bit registers) is maintained without change (i.e., is latched in the bit registers). Of course, at that time, both the set signal S and the reset signal $\bar{R}$ are made ineffective.

Further, as shown in the fifth line of Table I, when the reset signal $\bar{R}$ supplied to a predetermined bit register becomes effective (i.e., "0"), the corresponding bit register is initially reset (i.e., the output Q of the bit register is initially set to "0"). At that time, the set signal S is made ineffective (i.e., "0"). Also, as shown in the sixth line of the Table I, when the set signal S supplied to a predetermined bit register becomes effective (i.e., "1"), the corresponding bit register is initially set to "1"). In this connection, the symbol "*" shown in the above Table I means that the value of the corresponding data (or signal) has no influence on the result of the output Q of the bit register.

Figure 4:
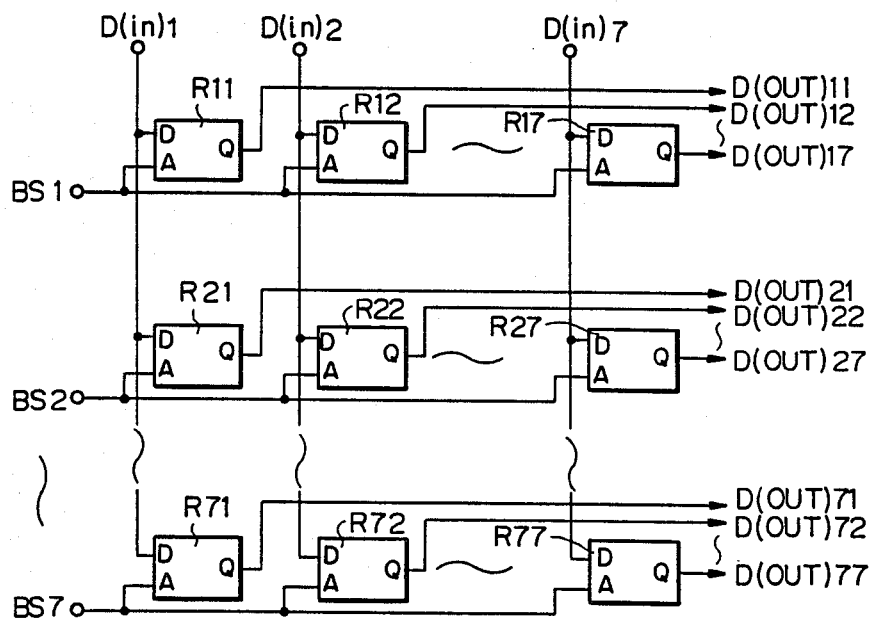
FIG. 4 is a block diagram showing the entire construction of the register circuit according to another embodiment of the present invention.

FIG. 4 shows the entire construction of another embodiment of the register circuit according to the present invention. As shown in FIG. 4, the register circuit comprises $\underline{n}$ rows × $\underline{m}$ columns of bit registers (in this case, seven rows × seven columns of bit registers R11 to R17, R21 to R27, ..., R71 to R77) arranged in a matrix state.

A bit selection signal (corresponding to an address signal) BS1 is input to the bit registers R11 to R17 arranged in the first row of the bit registers, a bit selection signal BS2 is input to the bit registers R21 to R27 arranged in the second row of the bit registers, and so on until a bit selection signal BS7 is input to the bit registers R71 to R77 arranged in the seventh row of the bit registers. Also, data D(in)1 is input to the bit registers R11 to R71 arranged in the first column of the bit registers, data D(in)2 is input to the bit registers R12 to R72 arranged in the second column of the bit registers, and so on until data D(in)7 is input to the bit registers R17 to R77 arranged in the seventh column of the bit registers.

Accordingly, when the effective data (e.g., "1") is input at the time that one of the bit selection signals BS1 to BS7 is effective (e.g., "1"), the effective data is set in the bit register to which the effective data and the effective bit selection signal are input, and the remaining bit registers arranged in the same column as that of the bit register in which the above effective data is set are reset simultaneously with the setting of the above effective data in the above bit register.

For example, if the bit selection signal BS1 becomes effective (in this case, "1") and the effective data D(in)1 is input to the bit registers R11 to R71 when the effective data "1" is set in the bit register R21, for example, the effective data "1" is set in the bit register R11 to which the effective bit selection signal BS1 and the effective data D(in)1 are input, and as a result, the output D(OUT)11 of the bit register R11 becomes "1" (e.g., high potential level). Simultaneously, the bit register R21 is automatically reset as the bit selection signal BS2 is made ineffective (i.e., "0") at that time, and as a result, the output D(OUT)21 of the bit register R21 becomes "0" (e.g., low potential level). Accordingly, in the bit registers arranged in the same column (e.g., the bit registers R11 to R71), the effective data "1" is set in only one of the selected bit registers (e.g., the bit register R11), and at that time, the remaining bit registers (in this case, the bit registers R21 to R71) are reset. Namely, in the above case, the output D(OUT)11 of the bit register R11 becomes "1" and the outputs D(OUT)21 to D(OUT)71 of the bit registers R21 to R71 become "0". Accordingly, it is possible to prevent a double registration in each column of the bit registers, without the need for a complicated operation.

In the above circuit shown in FIG. 4, although the gate signal G, the set signal S, and the reset signal $\bar{R}$ are not shown, these signals are supplied to each of the bit registers as shown in FIG. 2. In this connection, the gate signal may be commonly supplied to each of the bit registers to determine the timing for setting or resetting predetermined bit registers. Also, the set signal and the reset signal may be separately supplied to each of the bit registers to initially and independently set or reset each of the bit registers.

Therefore, by using the register circuit shown in FIG. 4, it is possible to correctly register interruption priority orders for interruption signals input from a plurality of systems positioned at the outside, for example. Namely, when the interruption priority orders for seven systems (i.e., first to seventh systems) are registered in the register circuit as shown in FIG. 4, the register circuit is constructed so as to input the data D(in)1 to D(in)7 each corresponding to one of the interruption signals supplied from the first to the seventh systems and the bit selection signals BS1 to BS7 each corresponding to one of the interruption priority orders for the first to the seventh systems. Therefore, if the effective data D(in)1 is input when the bit selection signal BS1 is effective, the effective data Din)1 (i.e., the data "1") is set in the bit register R11 (i.e., the output D(OUT)11 of the bit register R11 becomes "1"), and as a result, the interruption priority order for the first system becomes the first order. Similarly, if the effective data D(in)7 is input when the bit selection signal BS2 is effective, the effective data D(in)7 (i.e., the data "1") is set in the bit register R27 (i.e., the output D(OUT) 27 of the bit register R27 becomes "1"), and as a result, the interruption priority order for the seventh system becomes the second order. By carrying out a similar operation, each interruption priority order for the first to the seventh systems may be selectively registered in one of the bit registers arranged in a predetermined column of the register circuit. In this connection, it is of course possible for the user to freely change the above order of the interruption priority for each system by carrying out the above operation.

Figure 5:
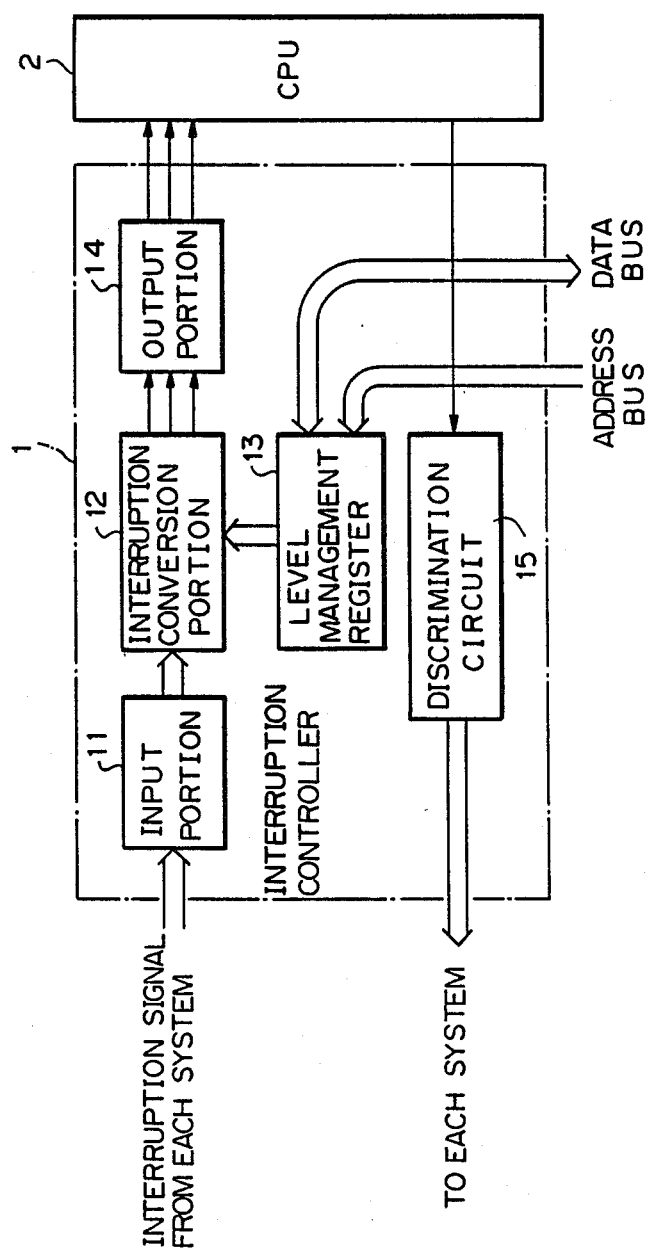
FIG. 5 is a block diagram showing the entire construction of an interruption controller in which the register circuit as shown in FIG. 4 is used.

FIG. 5 shows the entire construction of a interruption controller 1 including the register circuit shown in FIG. 4. An interruption signal from each of systems (e.g., from each of the above first to seventh systems) is input to an interruption conversion portion 12 through an input portion 11. A level management register 13 comprises the register circuit as shown in FIG. 4. The address signals (e.g., the bit selection signals BS1 to BS7 as shown in FIG. 4) are input through an address bus to the register circuit and the data D(in) (e.g., the data D(in)1 to D(in)7 as shown in FIG. 4) are input through a data bus to the register circuit. Therefore, the interruption priority orders for the above systems may be registered in predetermined bit registers arranged in a separate column of the bit registers, when the user supplies the effective data and the effective bit selection signal to each of the predetermined bit registers, as in the register circuit shown in FIG. 4. It is of course possible for the user to freely change the order of the interruption priority for each system by supplying predetermined effective data and predetermined bit selection signals through the address bus and the data bus to the register circuit.

Thus, if the interruption signal from one of the above systems (e.g., the first system) is input to the interruption conversion portion 12, a comparison between the input interruption signal and the outputs of the level management register 13 corresponding to the outputs of the above register circuit is carried out. Accordingly, the order of the interruption priority of the input interruption signal (e.g., the interruption signal from the first system) is detected, and the output signal having a level corresponding to the detected order of the interruption priority is supplied to the CPU 2 through the output portion 14. In this connection, if a plurality of interruption signals from more than one of the above systems are simultaneously input to the interruption conversion portion 12, the interruption conversion portion 12 detects which interruption signal has the highest order of interruption priority among the input interruption signals, and the output signal having a level corresponding to the detected highest order of the interruption priority is supplied to the CPU 2 through the output portion 14. Then, the CPU 2 acknowledges the interruption for the interruption signal supplied to the CPU 2 and the interruption acknowledge signal is transmitted from the CPU 2 to the discrimination circuit 15. The discrimination circuit 15 detects the acknowledge level corresponding to the interruption priority order for the acknowledged interruption signal and sends back a predetermined signal corresponding to the detected result to the system from which the acknowledged interruption signal is transmitted.

As above-mentioned, according to the present invention, in the register circuit comprising a plurality of bit registers, it is possible to set the effective data in only a selected bit register, and simultaneously reset the remaining bit registers, and thus prevent a double registration of the bit registers without the need for a complicated operation. As a result, it is, for example, possible to correctly register the interruption priority orders for the interruption signals input from a plurality of systems, and further, to freely change the order of the interruption priority for each system, if desired.

We claim:

1. A register circuit comprising:
   a plurality of registers commonly receiving a data signal and selection signals respectively, each of said registers including
   a first input terminal for receiving the data signal,
   a second input terminal for receiving a corresponding one of the selection signals,
   an output terminal for outputting a stored data signal,
   storing means, connected to said output terminal, for storing the data signal, and
   control means, connected to said storing means, said first input terminal, said second input terminal, and said output terminal, said control means for transferring the data signal to the storing means when the selection signal is effective and for resetting said storing means when the $\overline{R}$ at a signal is already stored in said storing means and the selection signal is not effective,
   wherein said control means includes logic means such that when one of the plurality of registers is selected to receive data, the remaining registers of the plurality of registers are simultaneously reset by said commonly received data signal.

2. A register circuit according to claim 1, wherein said control means comprises:
   a first NAND gate receiving the data signal and the corresponding selection signal,
   a second NAND gate receiving the stored data signal and an inverted signal of the data signal, and
   a third NAND gate receiving outputs of the first and second NAND gates and being connected to said storing means.

3. A register circuit according to claim 1, wherein said storing means comprises a flip-flop circuit connected to said control means, and means for initially setting the flip-flop to a predetermined state.

4. A register circuit according to claim 1, wherein said register circuit receives a plurality of data signals, said registers are divided into a plurality of groups, and each of said groups receives a corresponding one of the data signals.

* * * * *